United States Patent
Mangold (10) Patent No.: US 7,312,990 B2
(45) Date of Patent: Dec. 25, 2007

(54) ELECTRICAL ENCLOSURE INCLUDING ACCESSIBLE FAN TRAY ASSEMBLY

(75) Inventor: Urs Mangold, Fremont, CA (US)

(73) Assignee: Elma Electronic Inc., Fremont, CA (US)

( * ) Notice: Subject to any disclaimer, the term of this patent is extended or adjusted under 35 U.S.C. 154(b) by 299 days.

(21) Appl. No.: 11/113,888

(22) Filed: Apr. 25, 2005

(65) Prior Publication Data

US 2006/0237208 A1    Oct. 26, 2006

(51) Int. Cl.
*H05K 7/20* (2006.01)
*F28F 7/00* (2006.01)

(52) U.S. Cl. .................. 361/695; 361/683; 361/720; 165/80.3

(58) Field of Classification Search ........ 361/694–695, 361/720–721, 683; 165/80.3, 104.33; 454/184; 211/26; 312/223.2
See application file for complete search history.

(56) References Cited

U.S. PATENT DOCUMENTS

| | | | | |
|---|---|---|---|---|
| 2,584,173 A | * | 2/1952 | Van Fowler | 312/303 |
| 2,869,958 A | * | 1/1959 | Hough | 312/323 |
| 4,487,461 A | * | 12/1984 | Tindall et al. | 312/323 |
| 5,267,121 A | * | 11/1993 | Uchida et al. | 361/694 |
| 6,310,770 B1 | * | 10/2001 | Negishi | 361/695 |
| 6,421,238 B1 | * | 7/2002 | Negishi | 361/695 |
| 6,480,381 B2 | * | 11/2002 | Negishi | 361/695 |
| 6,487,075 B2 | * | 11/2002 | Negishi | 361/695 |
| 6,499,609 B2 | * | 12/2002 | Patriche et al. | 211/175 |
| 6,795,309 B2 | * | 9/2004 | Hartung et al. | 361/685 |
| 6,801,428 B2 | * | 10/2004 | Smith et al. | 361/687 |
| 7,097,047 B2 | * | 8/2006 | Lee et al. | 211/26.2 |
| 7,133,285 B2 | * | 11/2006 | Nishimura | 361/715 |
| 2005/0117316 A1 | * | 6/2005 | Wrycraft | 361/802 |

FOREIGN PATENT DOCUMENTS

| DE | 202004004198 U1 | | 8/2004 |
|---|---|---|---|
| JP | 2005108969 A | * | 4/2005 |

* cited by examiner

*Primary Examiner*—Jayprakash Gandhi
*Assistant Examiner*—Robert J. Hoffberg
(74) *Attorney, Agent, or Firm*—Vierra Magen Marcus & DeNiro LLP (57) ABSTRACT

An enclosure for housing electronic circuit boards, which enclosure includes a fan tray assembly which may be easily removed from and inserted into the enclosure.

23 Claims, 10 Drawing Sheets

ELECTRICAL ENCLOSURE INCLUDING ACCESSIBLE FAN TRAY ASSEMBLY

BACKGROUND OF THE INVENTION

1. Field of the Invention

This invention relates generally to the field of enclosures for housing electronics, and in particular to an enclosure for housing electronics which includes a fan tray assembly which may be easily removed from and inserted into the enclosure.

2. Description of the Related Art

Figure 1:
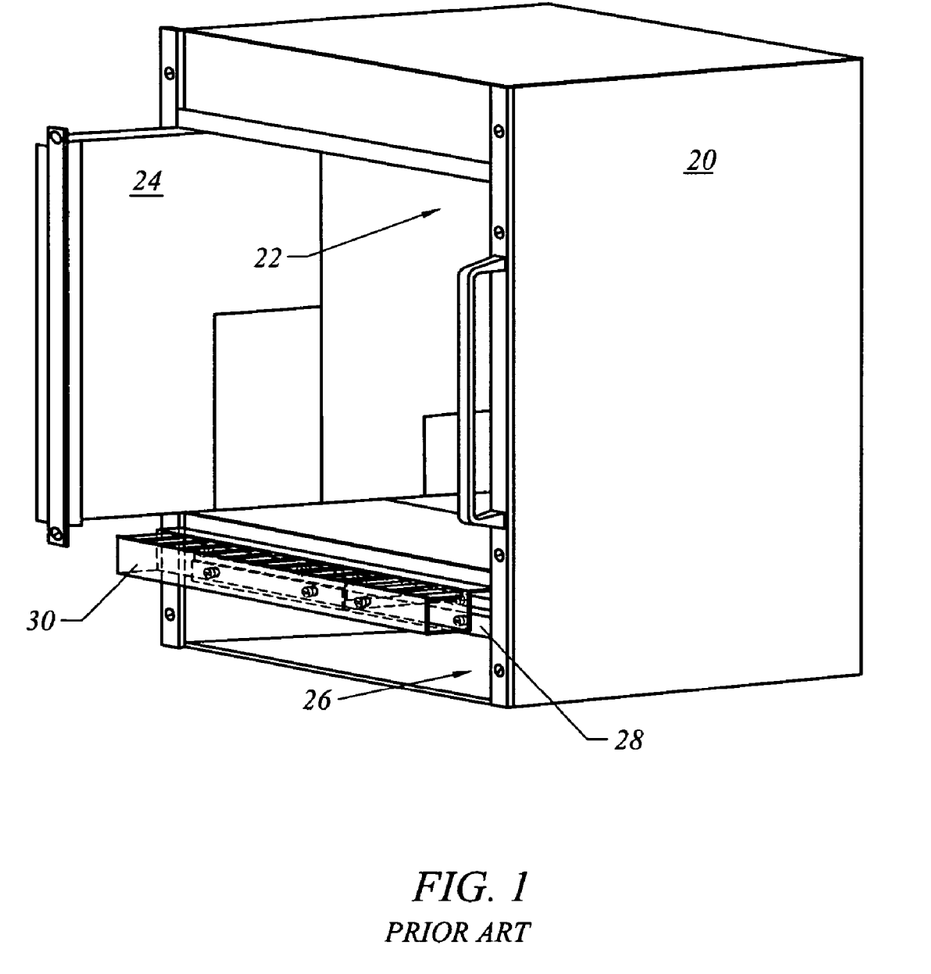
FIG. 1 is the prior art perspective view of an electrical enclosure showing the cable tray obstructing access to the fan tray assembly.
Figure 2:
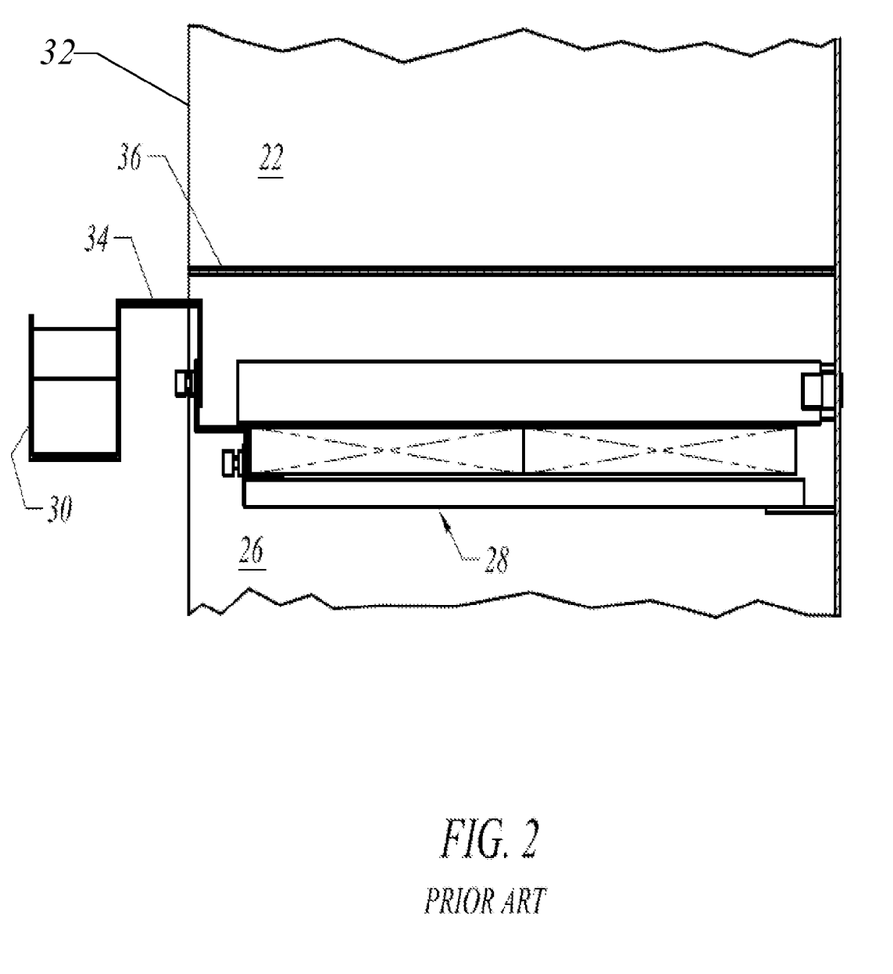
FIG. 2 is a side view of the prior art electrical enclosure showing the cable tray obstructing access to the fan tray assembly.

Enclosures for housing electronic circuit boards are widely used in a variety of technologies, including telecommunications, industrial control, medical electronics, and military applications. As shown in prior art FIGS. 1 and 2, such enclosures 20 include a main compartment 22 for receiving a plurality of electronic circuit boards 24 in a side-by-side relation. Each of the circuit boards 24 electrically connects to a backplane at a rear of the main compartment. Conventional enclosures may further include a bottom compartment 26 beneath the main compartment 22, which bottom compartment may include one or more fan tray assemblies 28 for circulating relatively cool air surrounding the electrical enclosure into the main compartment to conduct heat away from the electronic circuit boards and main compartment.

Conventional enclosures may further include a cable tray 30 mounted on a front of enclosure 20. Cable tray 30 defines a trough for receiving electrical cables emanating from within the main compartment. The cable tray routes the cables to either side of, and away from, the enclosure 20. As seen in prior art FIGS. 1 and 2, the cable tray is mounted in front of, and spaced from, a front face 32 of enclosure 20, and cable tray 30 has an upper surface 34 below a bottom surface 36 of the main compartment 22. The cable tray 30 is mounted below bottom surface 36 so as not to interfere with the circuit boards 24 as they are inserted into and taken out of main compartment 22.

A difficulty resulting from this construction is that the cable tray 30 lies in front of the fan tray assemblies 28 in the bottom compartment 26. Lying in front of the fan tray assemblies, the cable tray largely obstructs access to the fan tray assemblies and makes it difficult to insert the fan tray assemblies and to remove the fan tray assemblies. Unfortunately, owing to their continual operation, frequent maintenance of the fan trays of the fan tray assemblies is required.

One solution to the difficulty in accessing the fan tray assemblies is found in German Utility Model No. DE 20 2004 004 198 U1 to Appenzeller and Rademacher GmbH, Daun, Germany. That reference discloses that the cable tray is mounted for translation up and down at the front of the electrical enclosure. Thus, when it is desired to access the fan tray assemblies behind the cable tray, the cable tray translates upward away from the fan tray assemblies, and one or more of the fan trays may then be slid straight out from the bottom compartment. A problem with this solution is that the front of the main compartment is often crowded with cables, and it is often difficult or impossible to raise the cable tray a sufficient amount to slide the fan tray(s) out.

Conventional fan tray assemblies further include one or more fan filters for filtering the air drawn into the main compartment by the fan trays. These fan filters tend to get clogged with airborne particles. In conventional electrical enclosures, the cable tray in general at least partially obstructs access to the fan filter as well as the fan trays. And in systems where the fan filters are not obstructed by the cable tray, the fan filters slide straight out from the bottom compartment. In sliding straight out, the fan filters often scrape against the bottom surface of the fan trays. Contact with the filter often dislodges particles and debris trapped by the filter, and these particles and debris may then be drawn into the main compartment, thus defeating the purpose of the fan filters.

SUMMARY OF THE INVENTION

Embodiments of the present invention relate to an enclosure for housing electronic circuit boards, which enclosure includes a fan tray assembly which may be easily removed from and inserted into the enclosure beneath a cable tray. An embodiment of the invention includes an enclosure for housing electrical components, the enclosure including a front portion through which the electrical components are inserted, wherein the enclosure includes a main compartment for receiving the electrical components. The enclosure further includes a fan tray assembly capable of being removably mounted within a space beneath the main compartment. The fan tray assembly includes guide pins mounted on an exterior portion of the fan tray assembly, and guide rails mounted within the space. The guide rails include first and second slots, the first slot located nearer to the front portion of the enclosure than the second slot, and the guide pins residing within the first and second slots when the fan tray assembly is fully inserted within the enclosure.

In an embodiment, the guide pins move within the guide rails upon removal of the fan tray assembly from the enclosure to control the fan tray assembly to move in three motions. A first motion is of substantially horizontal translation toward the front portion of the enclosure. A second motion is of rotation of a front end of the fan tray assembly nearest the front portion of the enclosure, the rotation of the front end being down away from the main compartment. And a third motion is of translation out of the enclosure.

In a further embodiment of the present invention, the fan tray assembly further includes a filter capable of being removed from the fan tray assembly without dislodging particulates or debris trapped in the filter. In such an embodiment, the filter includes a rear portion with one or more flanges capable of mating within one or more openings formed in a rear wall of the enclosure when the fan tray assembly is mounted within the enclosure. The filter may be removed from the enclosure by detaching a front end of the filter from the fan tray assembly, rotating the front end down away from the fan tray assembly about an axis of rotation substantially through the one or more flanges, and then translating the filter out of the enclosure.

BRIEF DESCRIPTION OF THE DRAWINGS

The present invention will now be described with reference to the drawings.

DETAILED DESCRIPTION

The present invention will now be described with reference to FIGS. 3 through 15, which embodiments of the present invention relate to an enclosure for housing electronic circuit boards, which enclosure includes a fan tray assembly which may be easily removed from, and inserted into, the enclosure. While the enclosure may be used in technologies such as telecommunications, industrial control, medical electronics, and military applications, it is understood that the present invention is not limited to enclosures for such technologies, and may be used in enclosures intended for a variety of other technologies and applications.

Moreover, it is understood that the present invention may be embodied in many different forms and should not be construed as being limited to the embodiments set forth herein. Rather these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 3:
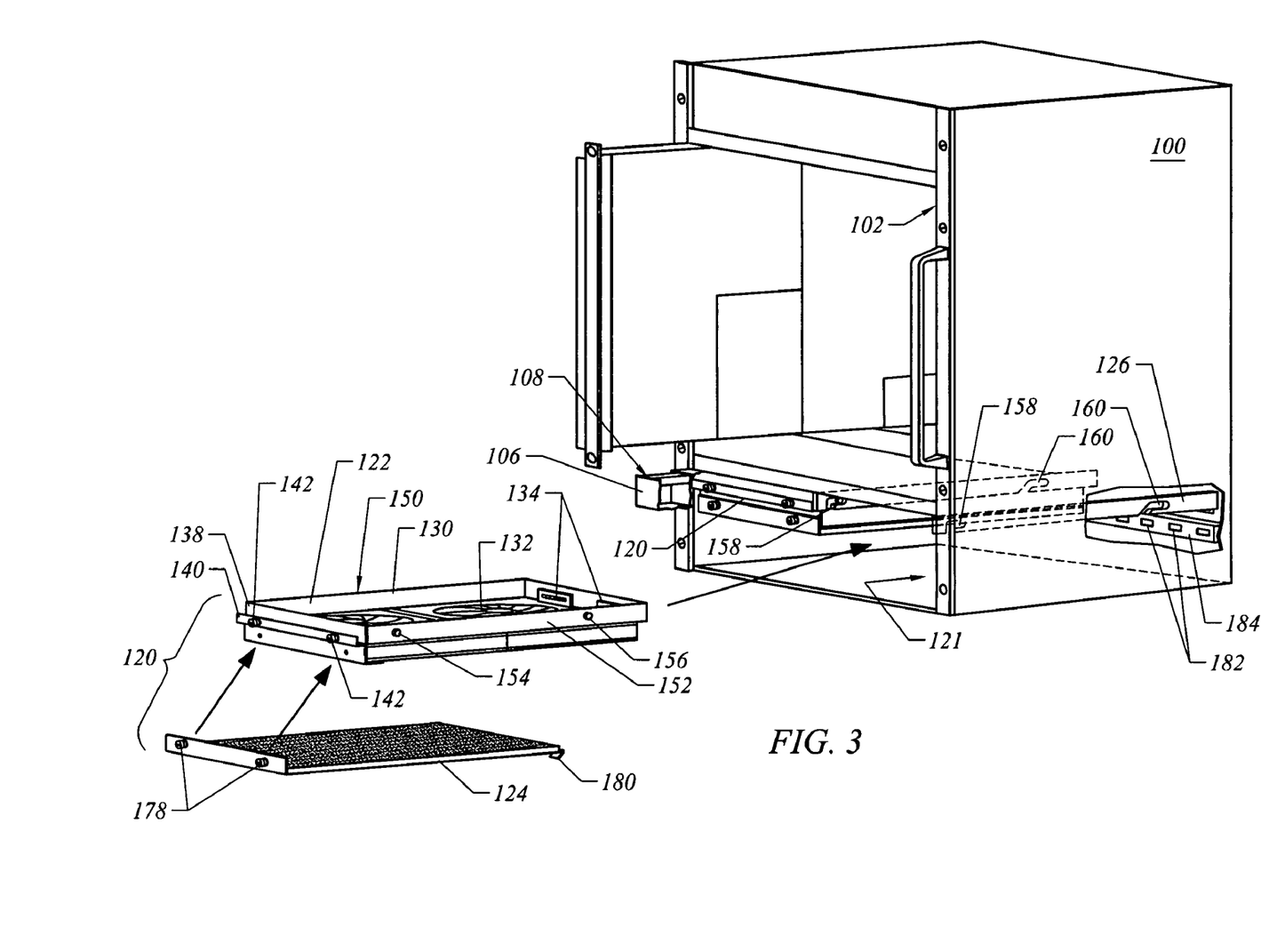
FIG. 3 is an exploded perspective view of an electrical enclosure including a fan tray assembly according to the present invention.
Figure 4:
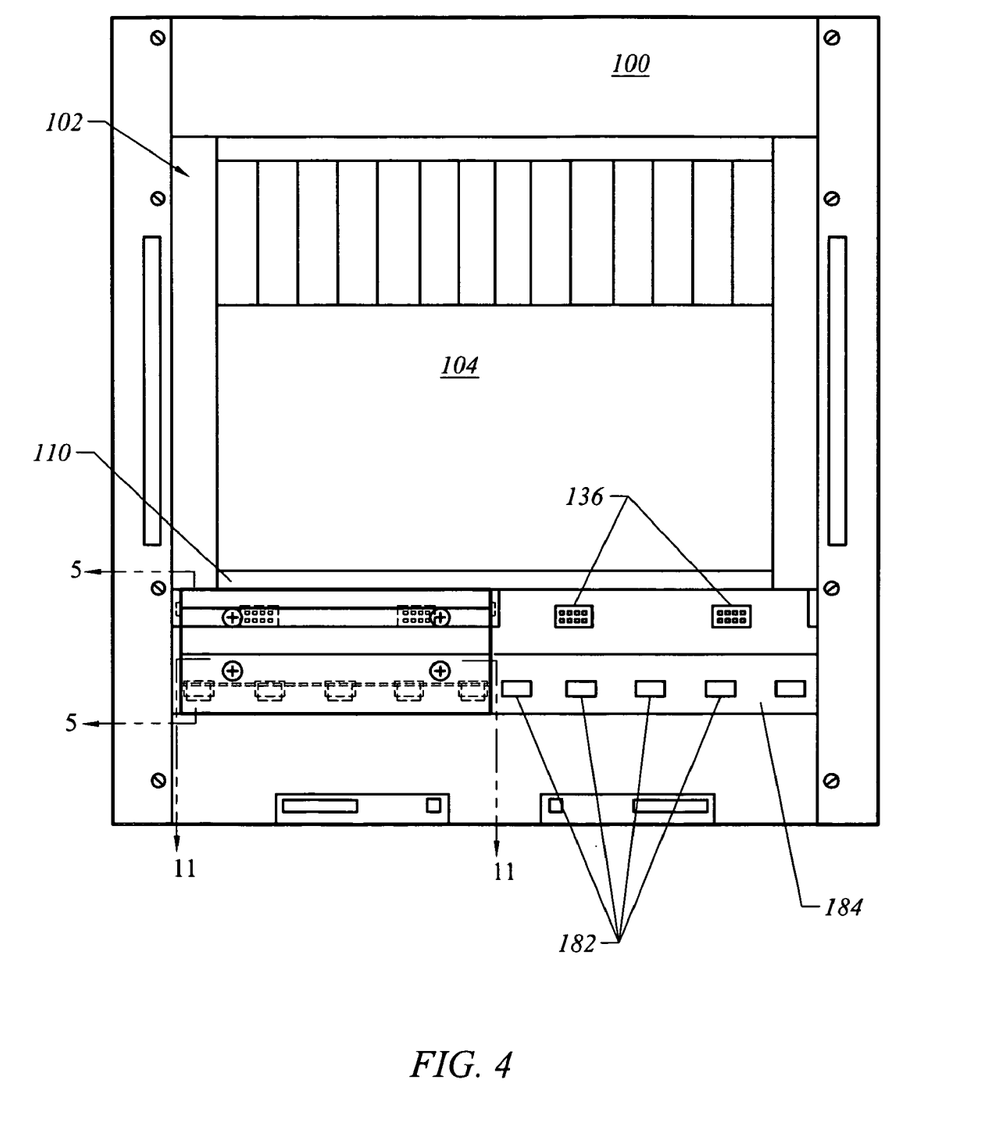
FIG. 4 is a front view of an electrical enclosure including a single fan tray assembly according to the present invention.

Referring now to the perspective view of FIG. 3 and the front view of FIG. 4, there is shown an enclosure 100 for housing electronic circuit boards. Enclosure 100 may include a main compartment 102 for receiving the electronic circuit boards in a side-by-side relation, a backplane 104 (FIG. 4) engaged by, and electrically connecting with, the circuit boards. A cable tray 106 may be spaced from, and mounted to, a front portion of enclosure 100 (cable tray 106 is shown cut-away in FIG. 3 and omitted from FIG. 4 for clarity). Cable tray 106 defines a trough for receiving electrical cables (not shown) emanating from within the main compartment. The cable tray routes the cables to either side of, and away from, the enclosure 100. Cable tray 106 may have an upper surface 108 at an elevation below a bottom surface 110 of the main compartment 102. Cable tray 106 is mounted below the bottom surface 110 so as not to interfere with the circuit boards as they are inserted into and taken out of main compartment 102.

According to embodiments of the present invention, one or more fan tray assemblies 120 may be mounted in a bottom compartment 121 beneath the main compartment 102. In embodiments, there need not be separate main and bottom compartments, but rather the fan tray assemblies 120 may be positioned in a space beneath the circuit boards. In the following description, components of a single fan tray assembly are described. However, it is understood that the following description applies to the components of each of the fan tray assemblies included within an enclosure 100.

In embodiments of the invention, fan tray assembly 120 may include a fan tray 122, a fan filter 124, and a plurality of guide rails 126 (seen in FIG. 4 and through the cut-away of enclosure 100 in FIG. 3). In alternative embodiments, the fan tray assembly 120 may be considered as including only fan tray 122 and filter 124, with guide rails 126 instead being considered part of enclosure 100. In an embodiment of the present invention shown in FIGS. 3 and 4, two fan tray assemblies 120 may fit side-by-side in bottom compartment 121, secured therein by three guide rails 126 (one guide rail 126 on either side of enclosure 100, and the third guide rail 126 mounted down the middle of enclosure 100 between the two fan tray assemblies 120). It is understood that enclosure 100 may operate with a single fan tray assembly 120 which extends horizontally across all or a portion of bottom compartment 121. Alternatively, more than two fan tray assemblies 120 may be provided side-by-side in bottom compartment 121 in further embodiments of the present invention.

Each fan tray 122 includes a frame 130 supporting one or more high volume fans 132 of known construction. Fans 132 receive power via fan power connector pins 134 which mate within fan power connector receptacles 136 (FIG. 4) as described in greater detail hereinafter. Frame 130 includes a front edge 138 having a flange 140 on which are mounted a pair of screw fasteners 142. Flange 140 may include one or more than two screw fasteners 142, or other types of fasteners, in alternative embodiments. As seen for example in FIG. 6, when the fan tray assembly 120 is seated within enclosure 100, screw fasteners 142 fit within threaded holes (not shown) in a plate 146 formed across a front surface of enclosure 100 to secure the fan tray assembly 120 within the enclosure.

Frame 130 further includes side walls 150 and 152 extending perpendicularly from front edge 138. Each of side walls 150 and 152 include a pair of guide pins 154 and 156 protruding therefrom. As explained hereinafter, each pair of guide pins 154, 156 rides within respective slots 158 and 160 formed in each of the guide rails 126. Frame 130 may be formed of cold rolled, zinc plated steel, but it is understood that frame 130 may be formed of other materials, including stainless steel, in alternative embodiments.

The cooperation of guide pins 154, 156 within slots 158, 160 of guide rails 126 to affect unobstructed removal and insertion of fan tray assembly 120 into enclosure 100 will now be described with reference to FIGS. 5 through 10. In embodiments, guide rails 126 extend from a front of the enclosure to the rear of the enclosure in a parallel relation to each other. Each of the guide rails may be spaced from each other a distance approximately equal to a width of a fan tray 122 (i.e., a distance approximately equal to a distance between side walls 150 and 152). Guide pins 154 and 156 protrude outward from side walls 150, 152 so as to require engagement within slots 158 and 160 in order to allow insertion of fan tray assembly 120 into enclosure 100 between a pair of adjacent guide rails.

Guide pins 154 and 156 protrude a small enough distance from side walls 150, 152 so that pairs of guide pins 154, 156 from adjacent fan tray assemblies 120 may each engage and move within slots of a single guide rail 126 without contacting each other. In embodiments of the invention, each guide pin 154, 156 may protrude approximately three millimeters beyond its respective side wall 150, 152. It is understood that guide pins 154 and 156 may protrude more or less than that in alternative embodiments of the invention.

Moreover, instead of guide pins from adjacent fan tray assemblies sharing a single guide rail 126 between them, a pair of guide rails 126 may be provided adjacent each other with one of the guide rails 126 receiving pins 154, 156 from one fan tray assembly, and the other guide rail 126 receiving guide pins 154, 156 from the adjacent fan tray assembly 120.

In embodiments where bottom compartment 121 receives two fan tray assemblies 120 side-by-side, three guide rails 126 may be mounted within bottom compartment 121; one guide rail on either side of the bottom compartment 121, and the third guide rail down the middle of the bottom compartment 121. It is understood that the number of guide rails may be decreased to two in embodiments including only a single fan tray assembly, and that the number of guide rails 126 may be increased to greater than three in embodiments where more than two fan tray assemblies 120 are provided side-by-side within bottom compartment 121.

Guide rails 126 may be tapped to receive screw fasteners (not shown) to affix the guide rails 126 within bottom compartment 121. Guide rails 126 may be affixed within bottom compartment 121 by other known fastening means in alternative embodiments of the present invention. In embodiments of the present invention, each guide rail may be approximately 294 millimeters long by approximately 25.4 millimeters high by approximately 6.35 millimeters thick. It is understood that each of these dimensions may vary in alternative embodiments of the present invention. In embodiments, guide rails 126 may be formed of cold rolled steel, stainless steel, or other comparable material.

Figure 5:
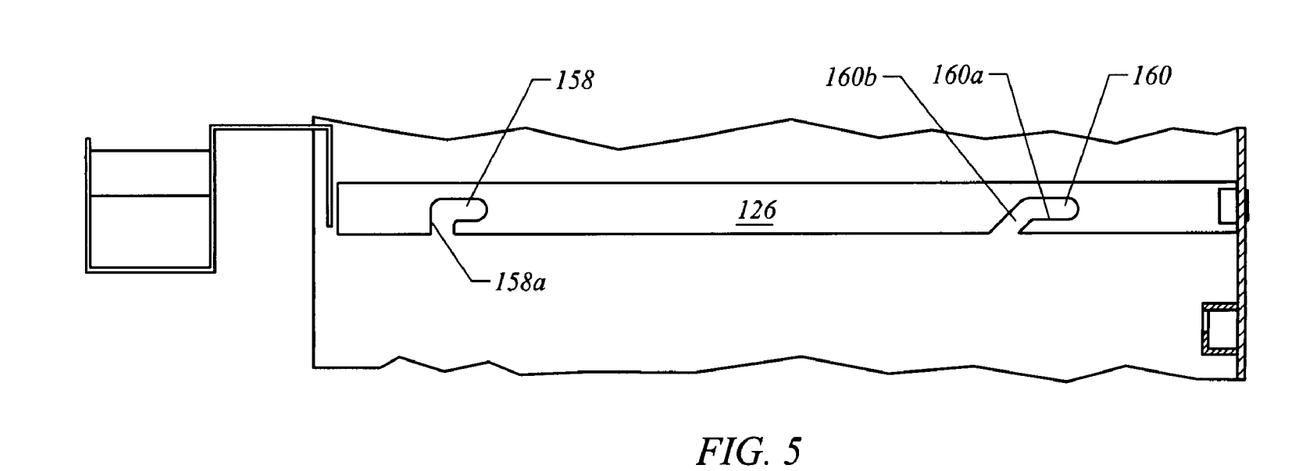
FIG. 5 is a cross-sectional side view through line 5-5 into the electrical enclosure of FIG. 4 showing a guide rail of a fan tray assembly according to the present invention.
Figure 6:
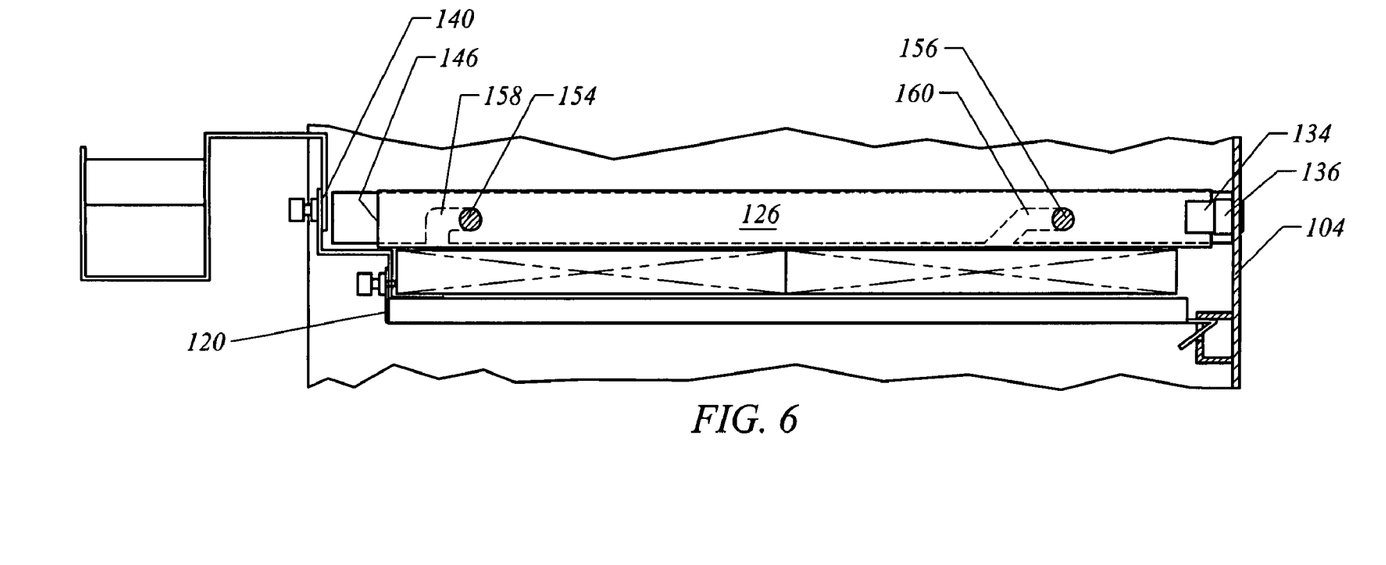
FIGS. 6-10 illustrate various positions of the fan tray assembly according to the present invention as it is removed from the electrical enclosure.

FIG. 5 is a cross-sectional side view through line 5-5 of FIG. 4. FIG. 5 shows a guide rail 126 without a fan tray assembly 120 engaged within slots 158 and 160. FIGS. 6-10 are similar views of guide rail 126 showing fan tray assembly 120 and guide pins 154, 156 engaged in various positions within the guide rail slots. FIG. 6 shows a fan tray assembly 120 fully engaged within enclosure 100. In this position, fan power connector pins 134 are engaged with fan power connector receptacles 136, and guide pins 154 and 156 are engaged in a rear-most position of slots 158 and 160. It is understood that one or both slots 158, 160 may extend further rearward (i.e., toward the backplane) than shown in FIG. 6, such that with fan tray assembly 120 in its fully inserted position (power pins 134 engaged within fan power connector receptacles 136) the guide pins 154 and/or 156 do not reside in the rear-most position of slot 158 and/or 160.

FIGS. 7 through 10 demonstrate the motion of one pair of guide pins 154, 156 in a guide rail 126 as a fan tray assembly 120 is withdrawn from enclosure 100. It is understood that the second pair of guide pins 154, 156 in the opposite side wall of the fan tray assembly 120 undergo a similar motion within their associated guide rail 126.

In order to remove fan tray assembly 120 from within bottom compartment 121, screw fasteners 142 are rotated to remove screw fasteners 142 from their respective threaded holes in plate 146 mounted on enclosure 100. The fan tray assembly 120 is thereafter pulled forward in horizontal translation (i.e., fan tray assembly 120 translates while remaining generally parallel to guide rail 126). The forward translation of fan tray assembly 120 continues until such translation is stopped as a result of guide pin 154 abutting against vertical edge 158*a* (FIG. 5) of slot 158. Guide pin 154 and vertical edge 158*a* are positioned so that, when guide pin 154 rests against vertical edge 158*a*, power pins 134 will be clear of fan power connector receptacles 136 as shown in FIG. 7.

A horizontal portion 160*a* (FIG. 5) of slot 160 is longer than the horizontal portion of slot 158. Thus, when pin 154 abuts against vertical edge 158*a*, pin 156 is still supported within the horizontal portion 160*a* of slot 160. As a result, the fan tray assembly 120 may be pulled forward to its maximum extent with guide pin 154 abutting against vertical edge 158*a* and the rear of the fan tray assembly remains supported in slot 160. Thus, there is no danger of guide pin 156 and the rear portion of fan tray assembly 120 falling out of slot 160 while the fan tray assembly is pulled forward as shown in FIG. 7.

Figure 7:
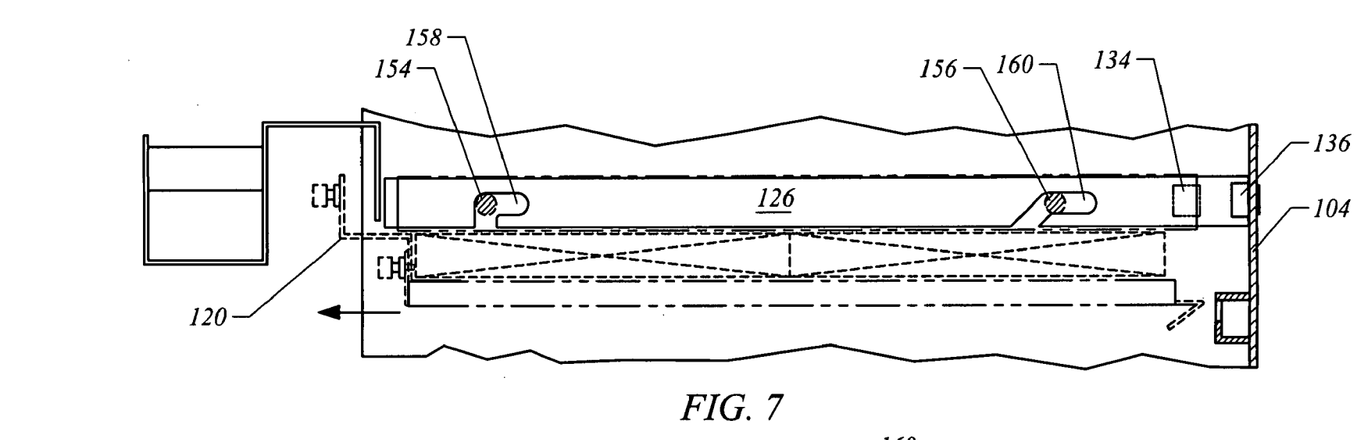
Figure 8:
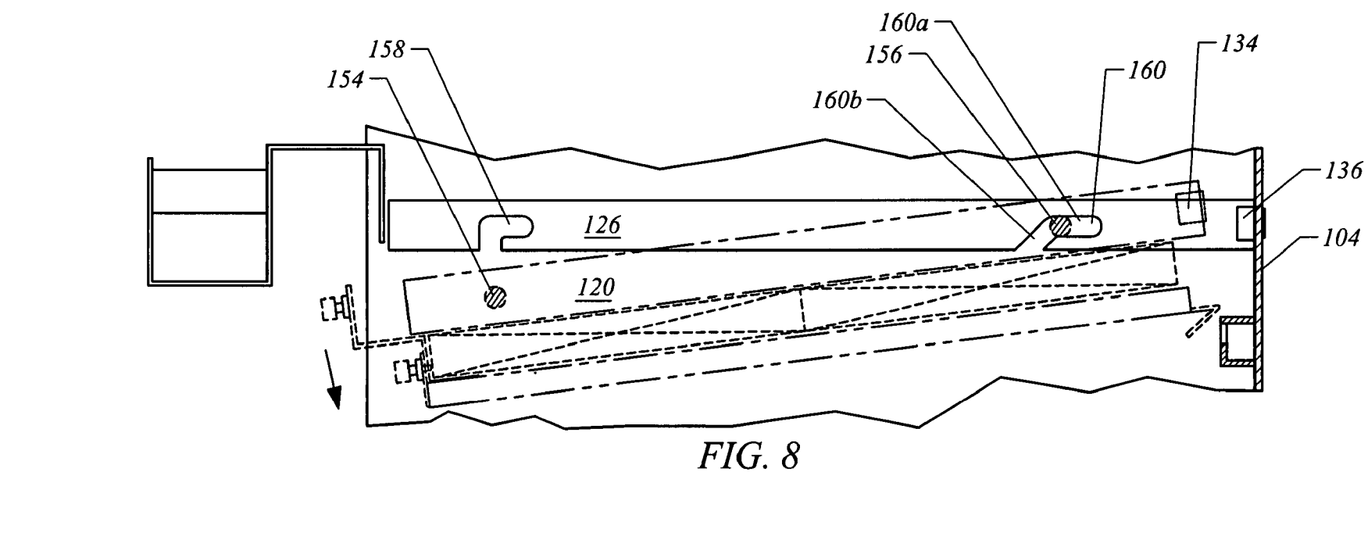
Figure 9:
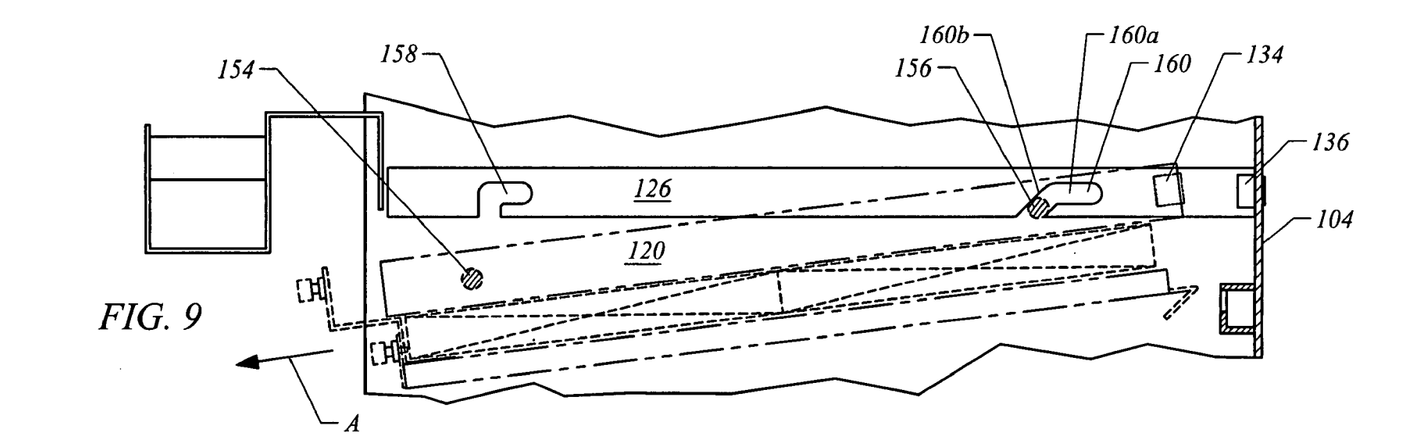
Figure 10:
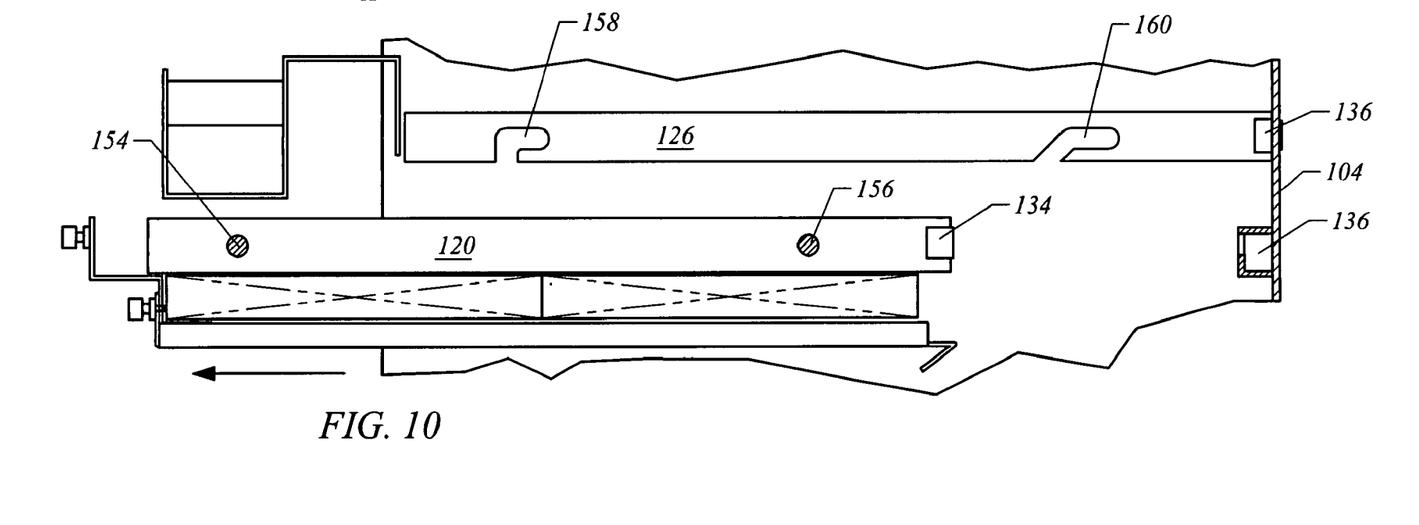

From the position shown in FIG. 7, the fan tray assembly may undergo rotation about guide pin 156 (which remains engaged in the horizontal section 160*a* of slot 160) to completely remove guide pin 154 from within slot 158 as shown in FIG. 8. Once guide pin 154 is clear of slot 158, fan tray assembly 120 may undergo translation generally in the direction of arrow A as shown in FIG. 9 while pin 156 rides down inclined surface 160*b* of slot 160 until pin 156 is clear of slot 160. Thereafter, as shown in FIG. 10, fan tray assembly 120 may be pulled straight out of bottom compartment 121 beneath cable tray 108.

It is understood that the reverse of the motion shown in FIGS. 6 through 10 may be provided to insert fan tray assembly 120 into enclosure 100. Mainly, fan tray assembly 120 may be slid into enclosure 100 until pin 156 engages within slot 160. Thereafter, fan tray assembly is slid rearward and rotated upward until guide pin 154 engages in slot 158, whereupon the fan tray assembly 120 translates rearward until power pins 134 engage within fan power connector receptacles 136. Portions of slots 158 and 160 where pins 154 and 156 first enter into the slots may be radiused and/or formed with inclined surfaces to make it easier for pins 154, 156 to engage within slots 158, 160 upon insertion of fan tray assembly 120 into enclosure 100.

While embodiments of the invention described above include guide pins 154, 156 mounted to fan tray 122, and guide rails 126 mounted to the enclosure, it is understood that the guide pins 154, 156 may instead be mounted to the enclosure, and the guide rails 126 mounted to the fan tray 122 in alternative embodiments. In such embodiments, the shape of slot 158 would be vertically and horizontally inverted relative to slot 158 described above, and the shape of slot 160 would be vertically and horizontally inverted relative to slot 160 described above.

In addition to the controlled motion of fan tray assembly 120 into and out of enclosure 100, embodiments of the present invention further include an insertion and removal scheme for filter 124 which prevents filter 124 from scraping against fan tray 122 upon the insertion or removal of the filter 124 from enclosure 100. During normal use, filter 124 is secured to fan tray 122 as a result of screw fasteners 178 fitting into threaded holes formed in front edge 138 of fan tray 122. Other fasteners are contemplated. However, it may be desirable to remove filter 124 while leaving fan tray 122 in position within enclosure 100.

Figure 11:
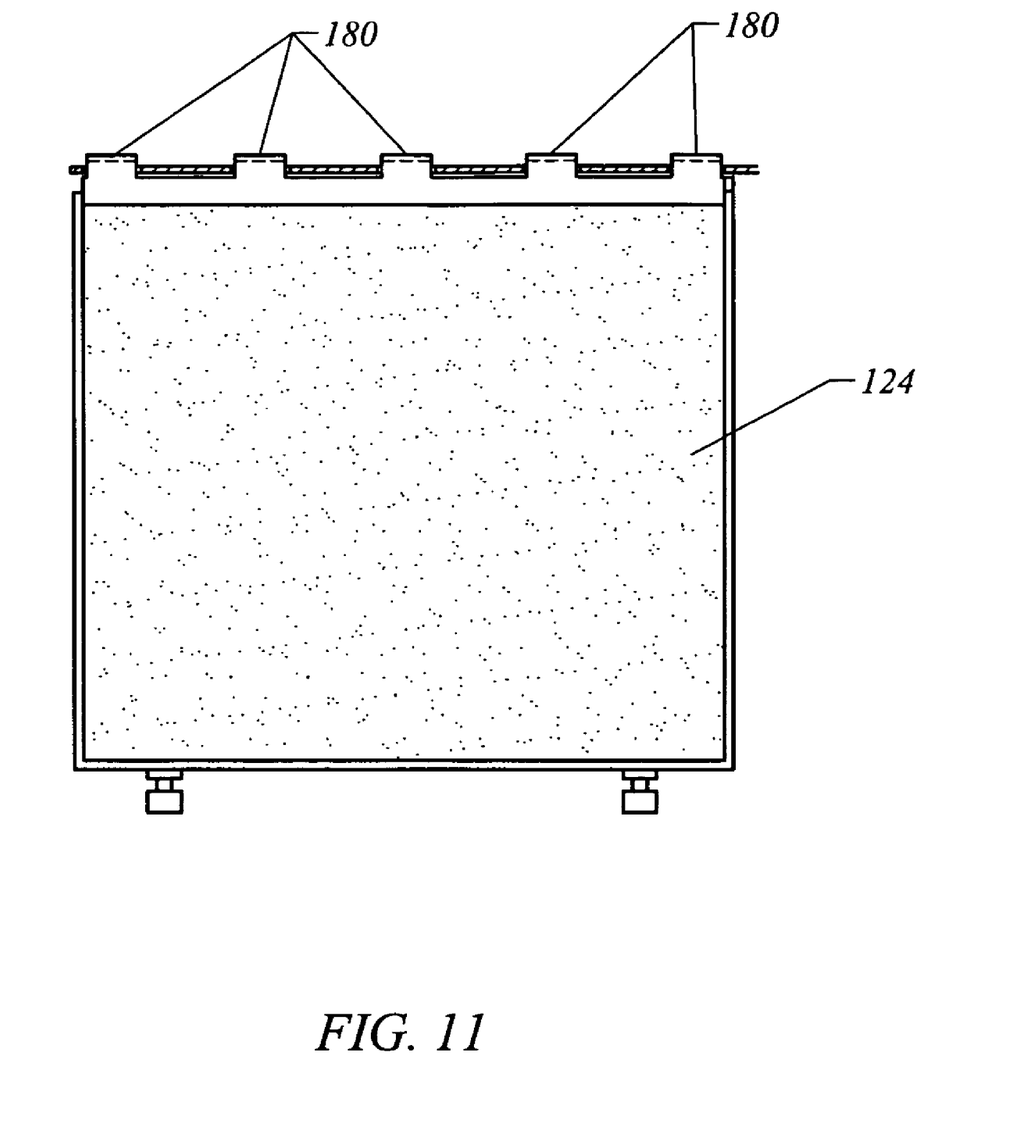
FIG. 11 is a cross-sectional view through line 10-10 in FIG. 4.

In accordance with such embodiments of the invention, a rear portion of filter 124 includes a plurality of flanges 180 which engage within a corresponding plurality of holes 182 formed within a member 184 on or adjacent to backplane 104 or the rear of the enclosure 100. Flanges 180 are seen for example in FIG. 3, FIG. 11, which is a cross-sectional view through line 11-11 of FIG. 4, and in FIGS. 12 through 15. Holes 182 are shown for example in FIGS. 3, 4 and 12 through 15. While five such flanges are shown in the figures, fitting within five corresponding holes 182, it is understood that there may be between one and four, or more than five corresponding flanges and holes in alternative embodiments.

Figure 12:
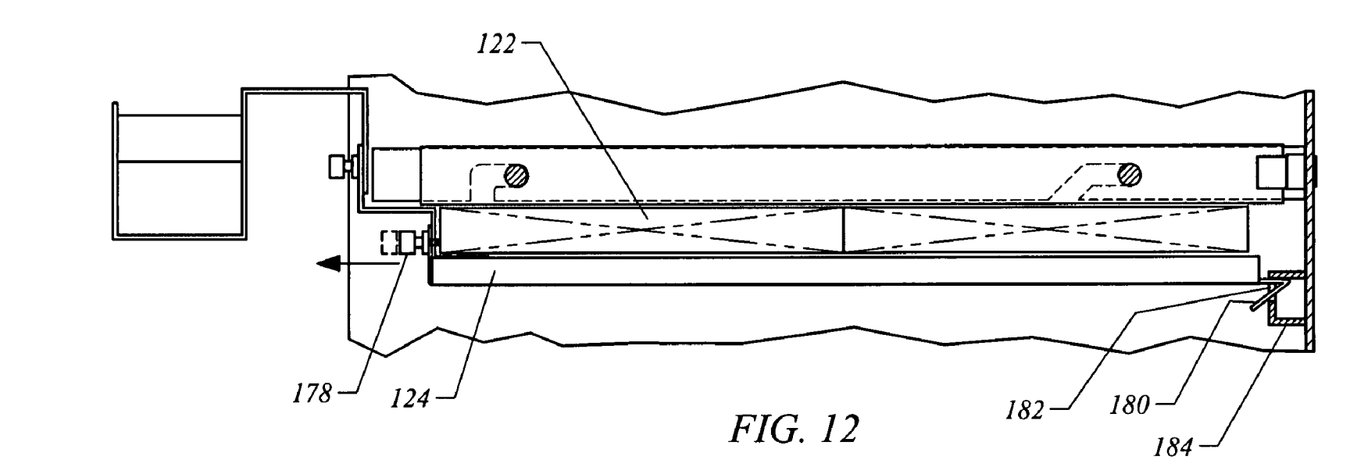
FIGS. 12-15 are cross-sectional side views into the electrical enclosure showing various positions of the fan filter as it is removed from a fan tray assembly and electrical enclosure.

Referring now to FIG. 12, when filter 124 is secured to fan tray 122, while fan tray 122 is secured within enclosure 100, flanges 180 reside within holes 182 in member 184. In order to remove filter 124 from fan tray 122, screw fasteners 178 are removed from their respective holes in front edge 138 as shown in FIG. 12. Thereafter, the front portion of filter 124 may be rotated downward, as shown in FIG. 13, while flanges 180 remain seated within holes 182.

Figure 13:
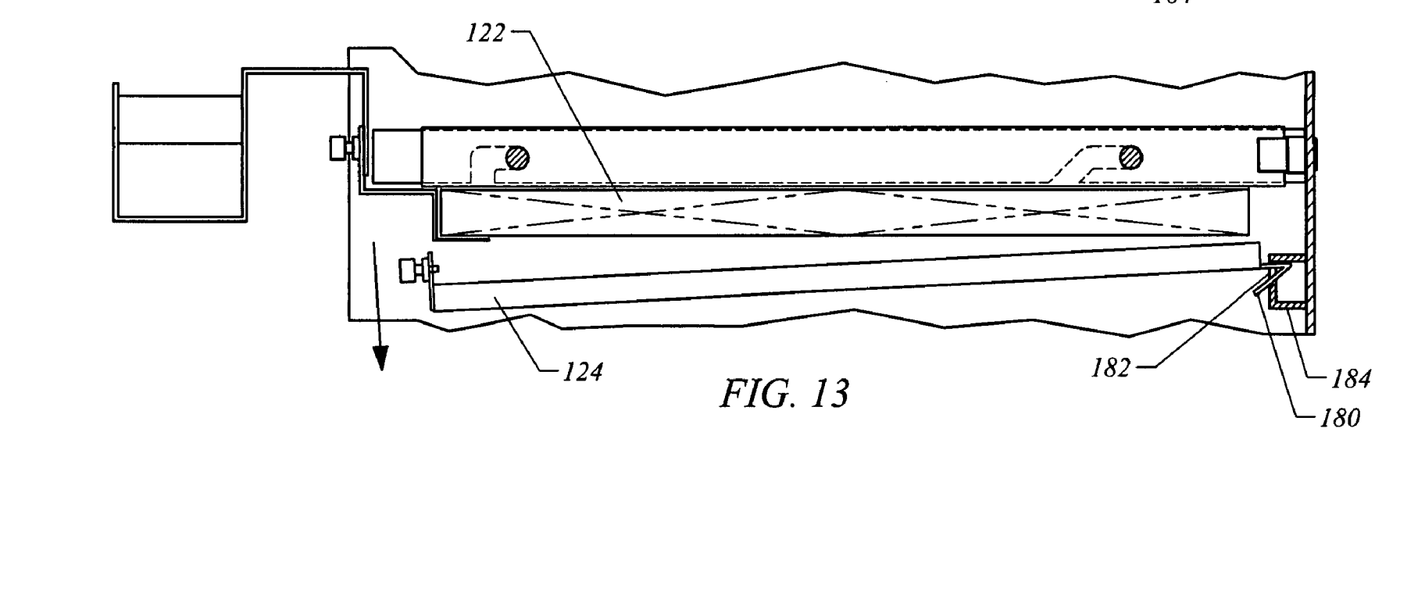
Figure 14:
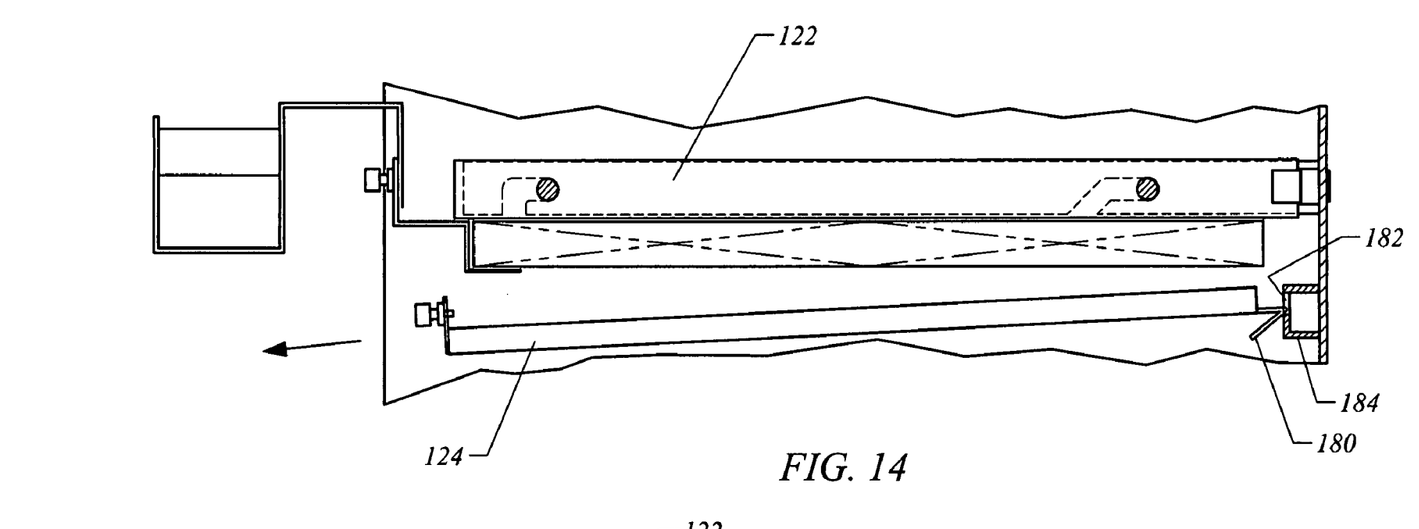
Figure 15:
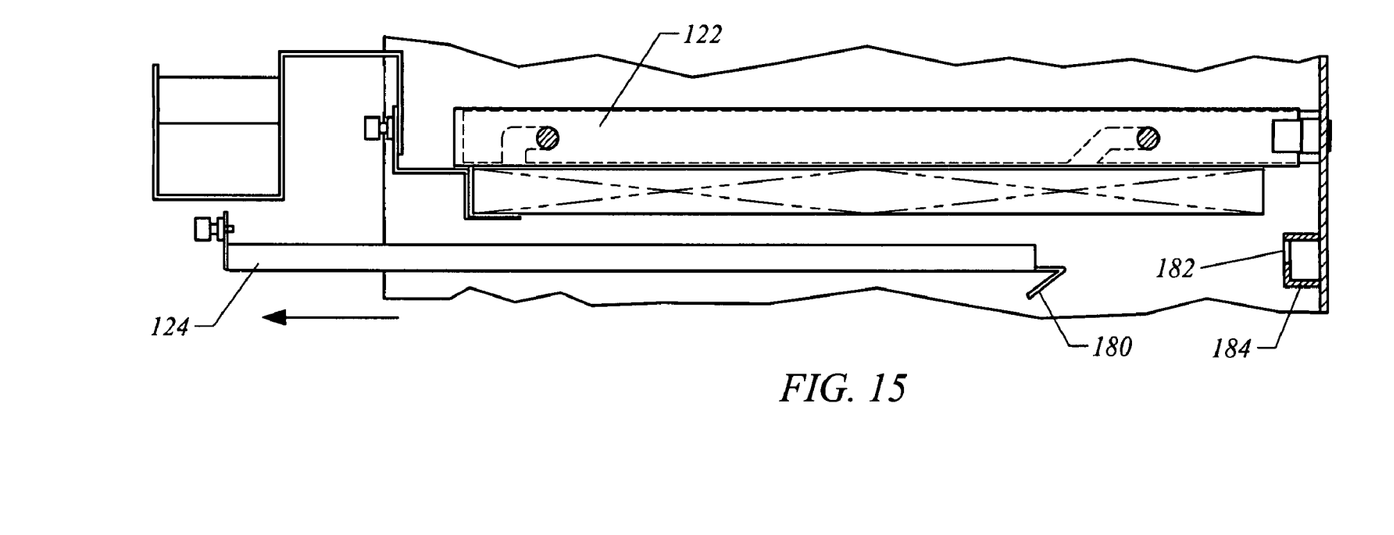

With the filter rotated downward to the position shown in FIG. 13, the filter 124 may thereafter be translated generally in the direction of arrow B as shown in FIG. 14 to withdraw flanges 180 from the holes 182. Rotated downward as described and with flanges 180 clear of holes 182, the filter 124 may be pulled generally straight out of the bottom compartment 121 as shown in FIG. 15. Translating as shown in FIG. 15, the filter 124 does not contact the fan tray or other components, and particulates and debris trapped within filter 124 are not dislodged. The downward rotation of the front portion of filter 124 also clears the filter 124 of any obstruction resulting from cable tray 108. Moreover, the positioning of flanges 180 within holes 182 as the front portion is rotated downward prevents the rear portion from falling downward which may also otherwise result in dislodging the particulates and debris.

The filter 124 may be inserted into the enclosure 100 for mounting on fan tray 122 in the reverse series of motions as those set forth above to remove filter 124 from enclosure 100. In particular, filter 124 may be inserted into bottom compartment 121 beneath the cable tray 108 and fan tray 122 until flanges 180 engage within holes 182. The front portion of filter 124 may then be rotated upward until the filter 124 lies in parallel relation to fan tray 122 whereupon screw fasteners 178 may be screwed into the threaded holes in front edge 138.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the claims to be added hereinafter.

I claim:

1. An enclosure for housing electrical components, the enclosure including a front portion through which the electrical components are inserted, and the enclosure further including a structure mounted at the front portion, the enclosure comprising:
   a main compartment for receiving the electrical components;
   a fan tray assembly capable of being removably mounted within a space beneath the main compartment, the structure at the front portion preventing the fan tray assembly from being pulled straight out of the enclosure, the fan tray assembly including a first mechanism capable of engaging with a second mechanism mounted to the enclosure, the first and second mechanisms cooperating to first lower the fan tray assembly to an elevation beneath the structure, and then translate the fan tray assembly out of the enclosure upon withdrawal of the fan tray assembly from the enclosure; and
   a filter removably mounted to the fan tray assembly, the filter including a front end nearest the front portion of the enclosure capable of detaching from the fan tray assembly and rotating down away from the fan tray assembly, the rotated filter then capable of being translated out of the enclosure.

2. An enclosure for housing electrical components as recited in claim 1, the electrical components comprising printed circuit boards.

3. An enclosure for housing electrical components as recited in claim 1, the structure comprising a cable tray.

4. An enclosure for housing electrical components as recited in claim 1, the filter capable of being removed with the fan tray assembly.

5. An enclosure for housing electrical components, the enclosure including a front portion through which the electrical components are inserted, comprising:
   a main compartment for receiving the electrical components;
   a fan tray assembly capable of being removably mounted within a space beneath the main compartment, the fan tray assembly, including:
      guide pins mounted on an exterior portion of the fan tray assembly, and
      guide rails mounted within the space, the guide rails including first and second slots, the first slot located nearer to the front portion of the enclosure than the second slot, the guide pins residing within the first and second slots when the fan tray assembly is fully inserted within the enclosure;
   wherein the first and second slots each have a horizontal portion for providing a first motion of the fan tray assembly during withdrawal of the fan tray assembly from the enclosure, the horizontal portion of the second slot being longer than the horizontal portion of the first slot, so that, during withdrawal of the fan tray assembly from the enclosure, a guide pin in the first slot clears the first slot while a guide pin in the second slot remains supported in the second slot.

6. An enclosure for housing electrical components as recited in claim 5, the electrical components comprising printed circuit boards.

7. An enclosure for housing electrical components as recited in claim 5, the second slot further comprising an inclined portion adjacent the horizontal portion, the guide pin in the second slot riding down the inclined portion after leaving the horizontal portion as the fan tray assembly is withdrawn from the enclosure.

8. An enclosure for housing electrical components as recited in claim 5, the enclosure further including a filter removably mounted to the fan tray assembly, the filter including a front end nearest the front portion of the enclosure capable of detaching from the fan tray assembly and rotating down away from the fan tray assembly, the rotated filter then capable of being translated out of the enclosure.

9. An enclosure for housing electrical components as recited in claim 8, the filter capable of being removed with the fan tray assembly.

10. An enclosure for housing electrical components as recited in claim 5, the fan tray assembly further including power connect pins capable of mating with fan power connector receptacles of the enclosure, the first motion of the fan tray assembly clearing the power connect pins from the fan power connector receptacles.

11. An enclosure for housing electrical components, the enclosure including a front portion through which the electrical components are inserted, comprising:
   a main compartment for receiving the electrical components;
   a fan tray assembly capable of being removably mounted within a space beneath the main compartment, the fan tray assembly, including:

guide pins mounted on an exterior portion of the fan tray assembly, and guide rails mounted within the space, the guide rails including first and second slots, the first slot located nearer to the front portion of the enclosure than the second slot, the guide pins residing within the first and second slots when the fan tray assembly is fully inserted within the enclosure;

wherein the guide pins move within the guide rails upon removal of the fan tray assembly from the enclosure to control the fan tray assembly to move in a first motion of substantially horizontal translation toward the front portion of the enclosure, a second motion of rotation of a front end of the fan tray assembly nearest the front portion of the enclosure, the rotation of the front end being down away from the main compartment, and a third motion of translation out of the enclosure.

12. An enclosure for housing electrical components as recited in claim 11, the front portion of the enclosure further including a cable tray, the first, second and third motions allowing the fan tray assembly to be withdrawn from the enclosure beneath the cable tray.

13. An enclosure for housing electrical components as recited in claim 11, the electrical components comprising printed circuit boards.

14. An enclosure for housing electrical components as recited in claim 11, the second slot further comprising an inclined portion adjacent the horizontal portion, the guide pin in the second slot riding down the inclined portion during the second motion.

15. An enclosure for housing electrical components as recited in claim 11, the enclosure further including a filter removably mounted to the fan tray assembly, the filter including a front end nearest the front portion of the enclosure capable of detaching from the fan tray assembly and rotating down away from the fan tray assembly, the rotated filter then capable of being translated out of the enclosure.

16. An enclosure for housing electrical components as recited in claim 11, the fan tray assembly further including power connect pins capable of mating with fan power connector receptacles of the enclosure, the first motion of the fan tray assembly clearing the power connect pins from the fan power connector receptacles.

17. An enclosure for housing electrical components, the enclosure including a front portion through which the electrical components are inserted, comprising:

a main compartment for receiving the electrical components;

a rear wall opposite the front portion, the rear wall including a section having one or more openings;

a fan tray assembly capable of being removably mounted within a space beneath the main compartment, the fan tray assembly including a filter having a rear portion with one or more flanges capable of mating within the one or more openings in the rear wall of the enclosure when the fan tray assembly is mounted within the enclosure, the filter capable of being removed from the enclosure by detaching a front end of the filter from the fan tray assembly, rotating the front end down away from the fan tray assembly about an axis of rotation substantially through the one or more flanges, and then translating the filter out of the enclosure.

18. A method of removing a fan tray assembly from an enclosure for electrical components, the enclosure including a front portion through which the electrical components are inserted, the fan tray assembly mounted beneath a compartment housing the electrical components, the method comprising the steps of:

(a) horizontally translating the fan tray assembly in a first motion to disengage connection points of the fan tray assembly with the enclosure;

(b) rotating a front end of the fan tray assembly nearest the front portion of the enclosure downward away from the main compartment, while a rear portion of the fan tray assembly opposite the front end is held in a position as an axis of rotation for the fan tray assembly; and (c) translating the fan tray assembly out of the enclosure after said steps (a) and (b).

19. A method of removing a fan tray assembly from an enclosure for electrical components as recited in claim 18, the enclosure including a guide rail including first and second slots, the first slot located nearer to the front portion than the second slot, and the fan tray assembly including guide pins for mating within the first and second slots, the first slot including a horizontal portion and a vertical portion, the second slot including a horizontal portion and an inclined portion, said step (a) of horizontally translating the fan tray assembly comprising the step of translating the fan tray assembly until a first guide pin riding the first slot contacts the vertical portion of the first slot.

20. A method of removing a fan tray assembly from an enclosure for electrical components as recited in claim 19, said step (a) of horizontally translating the fan tray assembly comprising the step of supporting a second guide pin in the second slot on the horizontal portion of the second slot when the first pin contacts the vertical portion of the first slot.

21. A method of removing a fan tray assembly from an enclosure for electrical components as recited in claim 19, said step (b) of rotating a front end of the fan tray assembly nearest the front portion of the enclosure downward away from the main compartment occurring while the second guide pin is supported in the second slot on the horizontal portion of the second slot.

22. A method of removing a fan tray assembly from an enclosure for electrical components as recited in claim 19, the second guide pin riding down the inclined surface of the second slot during said step (b) of rotating a front end of the fan tray assembly and/or said step (c) of translating the fan tray assembly out of the enclosure.

23. A method of removing a fan tray assembly from an enclosure for electrical components as recited in claim 19, said step (c) of translating the fan tray assembly out of the enclosure occurring when the first and second pins have cleared the first and second slots.

* * * * *